United States Patent
Yamashita

(10) Patent No.: US 9,035,535 B2
(45) Date of Patent: May 19, 2015

(54) ACOUSTIC WAVE DEVICE AND MULTILAYERED SUBSTRATE

(71) Applicant: Taiyo Yuden Co., Ltd., Tokyo (JP)

(72) Inventor: Takashi Yamashita, Kanagawa (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 348 days.

(21) Appl. No.: 13/666,520

(22) Filed: Nov. 1, 2012

(65) Prior Publication Data

US 2013/0134831 A1 May 30, 2013

(30) Foreign Application Priority Data

Nov. 29, 2011 (JP) ................. 2011-260972

(51) Int. Cl.

| H01L 41/053 | (2006.01) |
|---|---|
| H03H 3/08 | (2006.01) |
| H03H 9/02 | (2006.01) |
| H03H 9/05 | (2006.01) |
| H03H 9/10 | (2006.01) |

(52) U.S. Cl.
CPC ............. *H01L 41/053* (2013.01); *H03H 3/08* (2013.01); *H03H 9/02102* (2013.01); *H03H 9/02149* (2013.01); *H03H 9/0547* (2013.01); *H03H 9/1071* (2013.01)

(58) Field of Classification Search
CPC .......... H03H 9/02559; H03H 9/02574; H03H 9/14505; H03H 9/14517; G06G 7/195
USPC ........ 310/313 A, 313 B, 313 C, 313 D, 313 R
See application file for complete search history.

(56) References Cited

U.S. PATENT DOCUMENTS

| 6,417,574 | B1 * | 7/2002 | Misawa et al. ................. 257/778 |
| 7,154,206 | B2 * | 12/2006 | Shimada et al. ........... 310/313 R |
| 7,453,333 | B2 * | 11/2008 | Tanaka et al. ................. 333/195 |
| 8,334,737 | B2 * | 12/2012 | Yamaji et al. ................. 333/193 |
| 8,531,254 | B2 * | 9/2013 | Yamaji et al. ................. 333/193 |
| 2007/0096227 | A1 | 5/2007 | Lim et al. |
| 2008/0125662 | A1 | 5/2008 | Aikawa et al. |
| 2012/0241311 | A1 * | 9/2012 | Kato ........................ 204/192.12 |

FOREIGN PATENT DOCUMENTS

| JP | 2007-28195 A | 2/2007 |
| JP | 2007-129704 A | 5/2007 |
| JP | 2008-135998 A | 6/2008 |
| JP | 2009-225118 A | 10/2009 |
| JP | 2010-200198 A | 9/2010 |

* cited by examiner

*Primary Examiner* — Derek Rosenau
*Assistant Examiner* — Bryan Gordon
(74) *Attorney, Agent, or Firm* — Chen Yoshimura LLP

(57) ABSTRACT

An acoustic wave device includes: a substrate; a functional element that is located on the substrate and excites acoustic waves; a side wall portion that is made of a metal and is located on the substrate so as to surround the functional element; a metal plate that is located above the functional element and the side wall portion, and seals the functional element so that a space is formed above the functional element; and a terminal that is located on the substrate and further out than the side wall portion, and is electrically connected to the functional element.

9 Claims, 9 Drawing Sheets ent; and a terminal that is located on the substrate and further out than the side wall portion, and is electrically connected to the functional element.

According to another aspect of the present invention, there is provided a multilayered substrate including: a conductive layer and an insulating layer that are stacked; and the acoustic wave device according to claim 1 that is embedded in the multilayered substrate.

ACOUSTIC WAVE DEVICE AND MULTILAYERED SUBSTRATE

CROSS-REFERENCE TO RELATED APPLICATION

This application is based upon and claims the benefit of priority of the prior Japanese Patent Application No. 2011-260972, filed on Nov. 29, 2011, the entire contents of which are incorporated herein by reference.

FIELD

A certain aspect of the present invention relates to an acoustic wave device and a multilayered substrate.

BACKGROUND

The advancements in high performance of mobile communication devices such as mobile phones require acoustic wave devices, which are used as a filter, to reduce the size and height. Thus, the acoustic wave device may be formed as a wafer level package. A functional element that excites acoustic waves is sealed and protected in the acoustic wave device.

There is disclosed a technique that seals an IDT (Interdigital Transducer) with resin in Japanese Patent Application Publication No. 2008-135998 (Patent Document 1). There is disclosed a technique that seals the IDT with metal and resin in Japanese Patent Application Publication Nos. 2010-200198 and 2009-225118 (Patent Documents 2 and 3). There is disclosed a technique that seals the IDT with a cap wafer made of a piezoelectric substance, and provides a terminal piercing through the cap wafer in Japanese Patent Application Publication No. 2007-129704 (Patent Document 4). A boundary acoustic wave device is disclosed in Japanese Patent Application Publication No. 2007-28195 (Patent Document 5).

However, moisture resistance is not sufficient and heat release performance is low when the IDT is sealed with resin as disclosed in Patent Document 1. Low heat release performance causes low power durability. Resin is used in a part of a sealing portion in the technique disclosed in Patent Documents 2 and 3, and thus the moisture resistance and the heat release performance become low. The technique of Patent Document 4 needs a complicate fabrication process of the device including a process of providing a hole for extracting a terminal to a lid, and thus increases cost of the device. Only a terminal functions as a heat release path in the technique of Patent Document 5, and thus the heat release performance is not sufficient. The acoustic wave device may be embedded in a substrate. Heat of the acoustic wave device may be released by providing a via wiring for heat release to the substrate. However, a height of the terminal is different from that of a lid, and thus the process for providing the via wiring to the substrate becomes complicated and increases cost.

SUMMARY OF THE INVENTION

According to an aspect of the present invention, there is provided an acoustic wave device including: a substrate; a functional element that is located on the substrate and excites acoustic waves; a side wall portion that is made of a metal and is located on the substrate so as to surround the functional element; a metal plate that is located above the functional element and the side wall portion, and seals the functional element so that a space is formed above the functional element; and a terminal that is located on the substrate and

DETAILED DESCRIPTION

First Embodiment

Figure 1A:
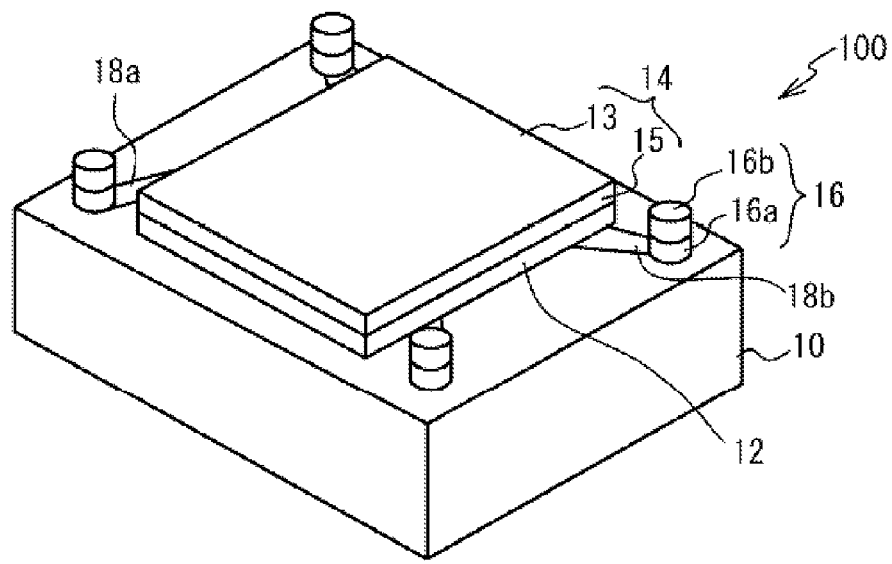
FIG. 1A is a perspective view illustrating an acoustic wave device in accordance with a first embodiment.
Figure 1B:
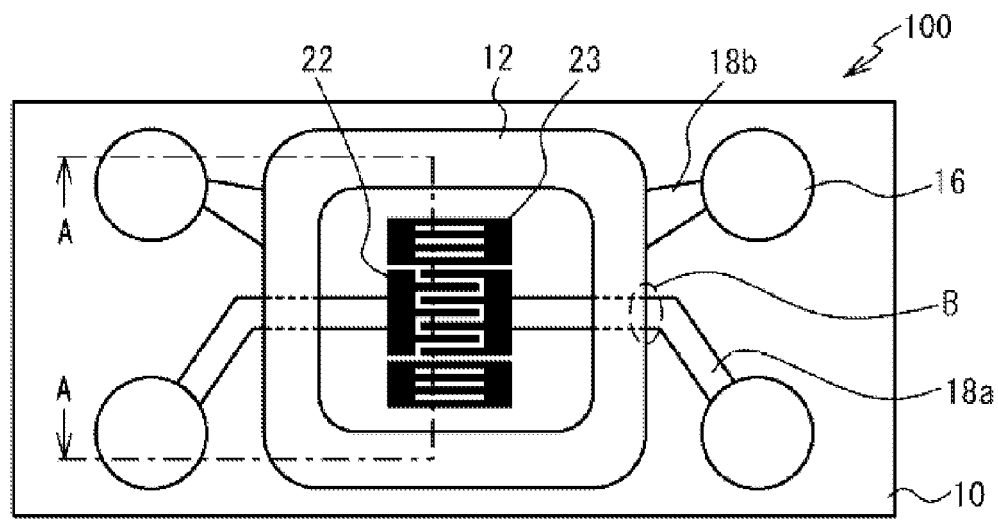
FIG. 1B is a top view of the acoustic wave device illustrating a lid transparently.
Figure 2A:
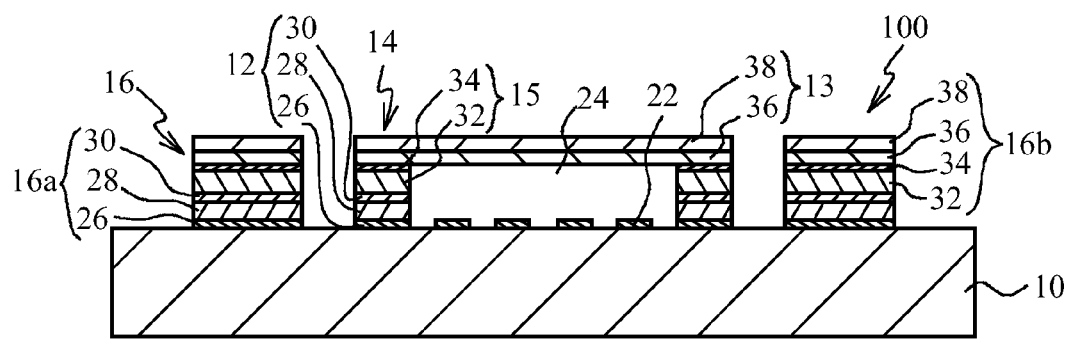
FIG. 2A is a cross-sectional view taken along line A-A in FIG. 1B.

A first embodiment is an exemplary SAW (Surface Acoustic Wave) device. FIG. 1A is a perspective view illustrating an acoustic wave device 100 in accordance with the first embodiment. FIG. 1B is a top view of the acoustic wave device 100 illustrating a lid 14 transparently. FIG. 2A is a cross-sectional view taken along line A-A in FIG. 1B.

As illustrated in FIG. 1A through FIG. 2A, on a piezoelectric substrate 10, located are an IDT 22, reflectors 23, a seal ring 12 (first side wall portion), and terminals 16. The IDT 22 and the reflectors 23 are not illustrated in FIG. 1A. Electrode fingers of the IDT 22 function as a functional element that excites acoustic waves. A plate portion 13 (metal plate) of the lid 14 is located away from the IDT 22 so as to form a space 24 above the IDT 22. Thus, the excitation of acoustic waves is not blocked. A peripheral portion 15 (second side wall portion) of the lid 14 and the seal ring 12 are bonded to each other by a solder 32 to form a side wall portion surrounding the IDT 22 and the reflectors 23. The side wall portion and the plate portion 13 seal the IDT 22 and the reflectors 23.

Substrate side terminal portions 16a and lid side terminal portions 16b are bonded to each other to form the respective terminals 16, and the terminals 16 are located further out than the seal ring 12. As illustrated in FIG. 1A and FIG. 1B, two of four terminals 16 are electrically connected to the IDT 22 by signal wirings 18a, and other two are electrically connected to the seal ring 12 by grounding wirings 18b. A height of an upper surface of the lid 14 is equal to those of upper surfaces of the terminals 16 when an upper surface of the piezoelectric substrate 10 is used as a reference, and is 50 μm for example.

The piezoelectric substrate 10 is made of a piezoelectric substance such as lithium tantalate (LiTaO$_3$) or lithium niobate (LiNbO$_3$) with a thickness of 250 μm for example. As illustrated in FIG. 2A, the seal ring 12 and the substrate side terminal portions 16a include a metal layer 26 mainly made of aluminum (Al), a nickel (Ni) layer 28 with a thickness of 20 μm, and a gold (Au) layer 30 with a thickness of 0.04 μm in this order from the piezoelectric substrate 10 side.

The lid 14 and the lid side terminal portions 16b include the solder 32 that has a thickness of 10 μm and is mainly made of tin silver (SnAg), an Au layer 34 with a thickness of 0.04 μm, an Ni layer 36 with a thickness of 10 μm, and a copper (Cu) layer 38 with a thickness of 10 μm in this order from the piezoelectric substrate 10 side. In the lid 14, the solder 32 and the Au layer 34 form the peripheral portion 15, and the Ni layer 36 and the Cu layer 38 form the plate portion 13. The IDT 22, the signal wirings 18a and the grounding wirings 18b are made of a metal mainly including Al, and are made of a metal layer same as the metal layer 26. The IDT 22 is hermetically sealed by the seal ring 12 and the lid 14 that are made of a metal. Thus, high moisture resistance and high heat release performance are ensured as compared to sealing the IDT 22 with resin. Since the heat release performance is high, the power durability is also improved.

Figure 2B:
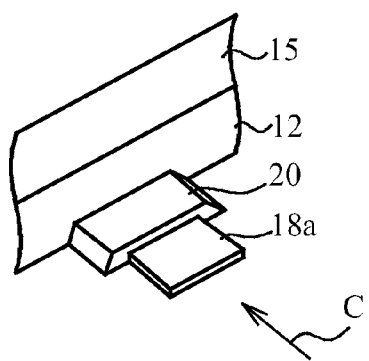
FIG. 2B is an enlarged view of a region surrounded by an ellipse B in FIG. 1B.
Figure 2C:
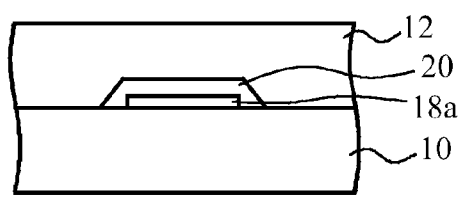
FIG. 2C is a side view observed from a direction indicated by an arrow C in FIG. 2B.

FIG. 2B is an enlarged view of a region surrounded by an ellipse B in FIG. 1B. FIG. 2C is a side view observed from a direction indicated by an arrow C in FIG. 2B. As illustrated in FIG. 2B and FIG. 2C, a resin portion 20 made of photosensitive resin such as epoxy resin is located between the signal wiring 18a and the seal ring 12. This insulates the signal wiring 18a from the seal ring 12. A periphery of the signal wiring 18a is sealed by the resin portion 20, but a region other than the periphery of the signal wiring 18a is sealed with metal, and thus the moisture resistance becomes high compared to sealing the whole portion with resin.

A description will now be given of a fabrication method of the acoustic wave device. FIG. 3A through FIG. 4D are cross-sectional views illustrating a fabrication method of the acoustic wave device 100 of the first embodiment.

Figure 3A:
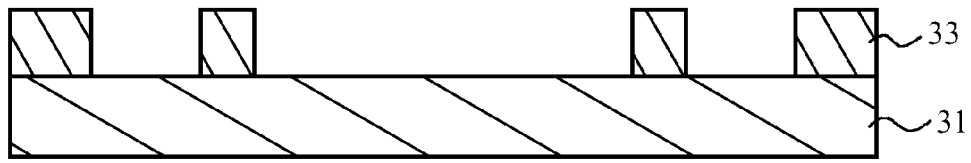
FIG. 3A through FIG. 3E are cross-sectional views illustrating a fabrication method of the acoustic wave device of the first embodiment.
Figure 3B:
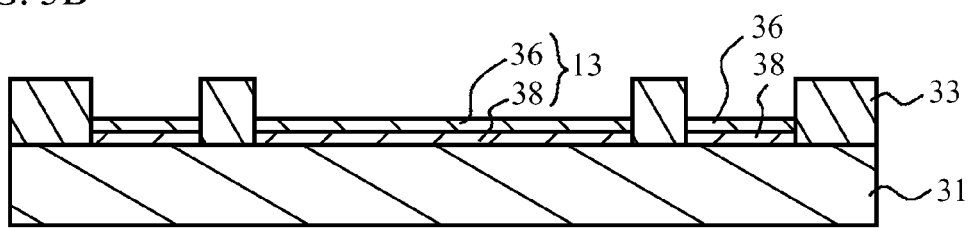
Figure 3C:
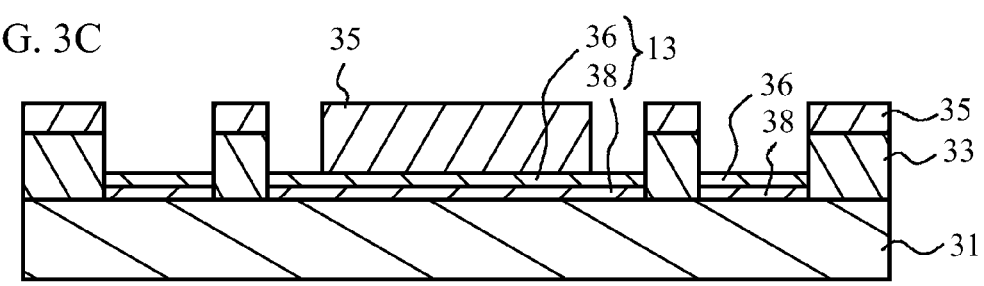
Figure 3D:
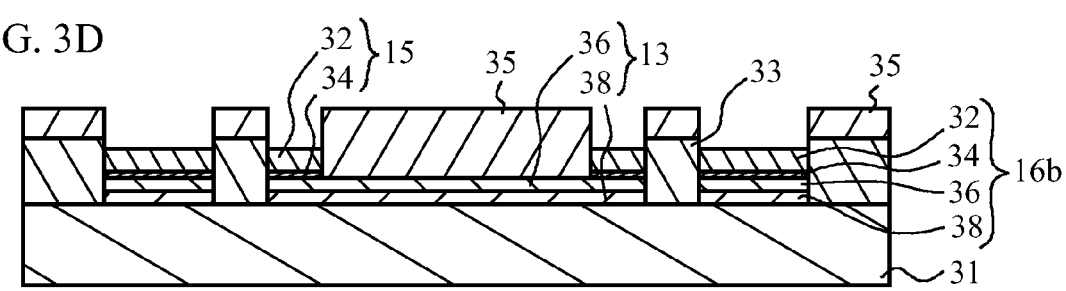
Figure 3E:
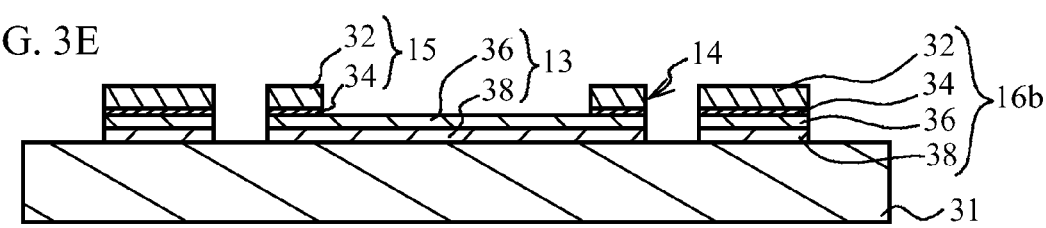

As illustrated in FIG. 3A, a resist 33 is formed on a support 31 made of stainless steel such as SUS304. The support 31 is a wafer on which regions corresponding to individual acoustic wave devices are arranged in a matrix shape. As illustrated in FIG. 3B, the Cu layer 38 and the Ni layer 36 are formed on the support 31 exposed from the resist 33 by electrolytic plating for example. As illustrated in FIG. 3C, a resist 35 is further formed on the resist 33 and the Ni layer 36. As illustrated in FIG. 3D, the Au layer 34 and the solder 32 are formed by electrolytic plating. As illustrated in FIG. 3E, the resists 33 and 35 are removed.

Figure 4A:
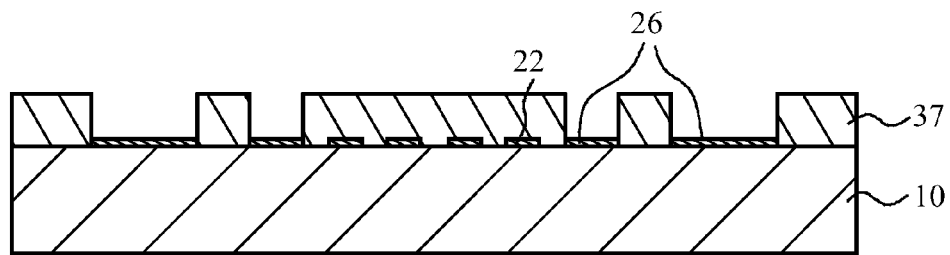
FIG. 4A through FIG. 4D are cross-sectional views illustrating the fabrication method of the acoustic wave device of the first embodiment.
Figure 4B:
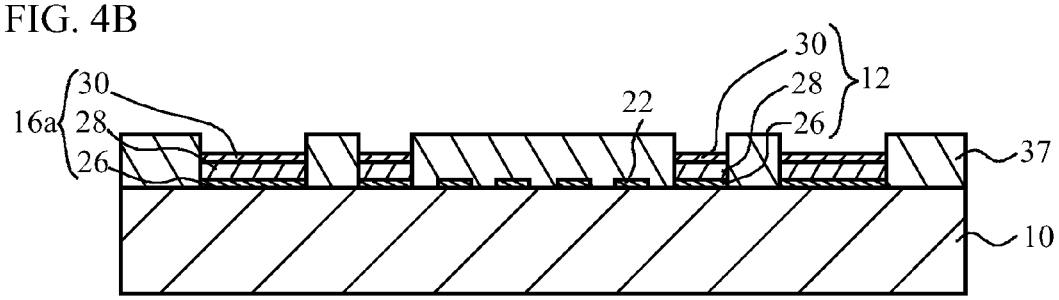
Figure 4C:
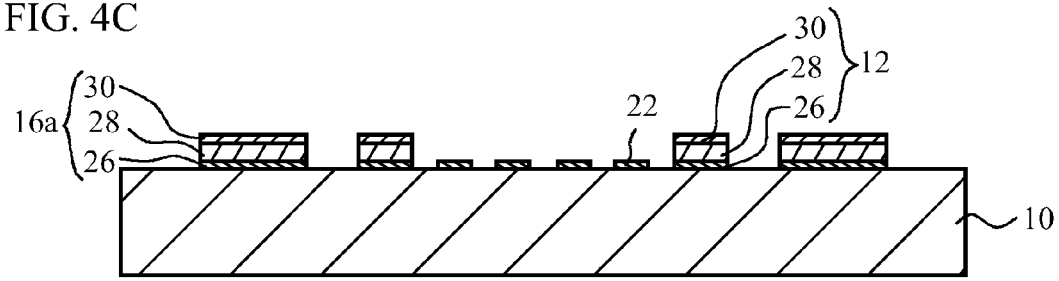
Figure 4D:
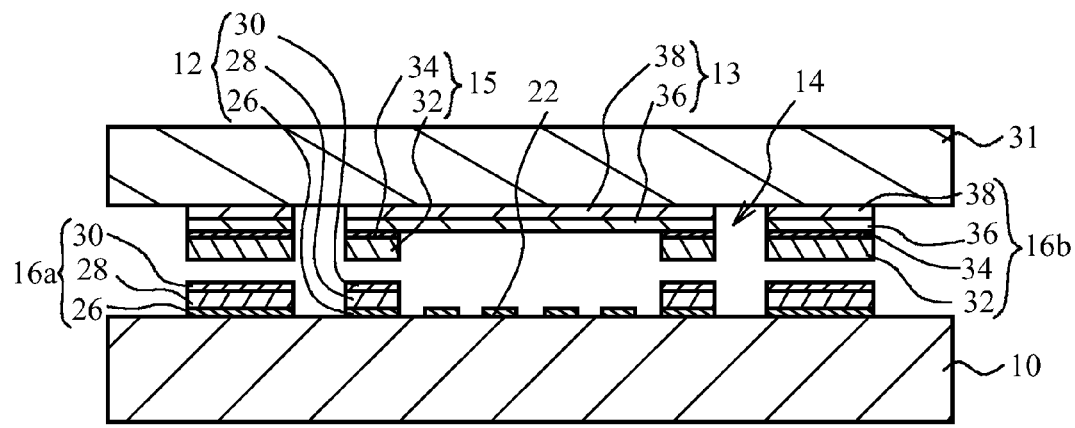

As illustrated in FIG. 4A, the metal layer 26 and the IDT 22 are formed on the piezoelectric substrate 10 in a wafer state. The signal wirings 18a and the grounding wirings 18b are also formed at this time (not illustrated). Then, a resist 37 is formed. The IDT 22 is covered with the resist 37. As illustrated in FIG. 4B, the Ni layer 28 and the Au layer 30 are formed on the metal layer 26 exposed from the resist 37 by electrolytic plating. As illustrated in FIG. 4C, the resist 37 is removed. As illustrated in FIG. 4D, the support 31 is disposed on the piezoelectric substrate 10 so that the solder 32 faces the Au layer 30. The solder 32 is heated to around 260° C. which is a temperature higher than its melting point, and the support 31 is pressed toward the piezoelectric substrate 10. The seal ring 12 is bonded to the peripheral portion 15, and the substrate side terminal portions 16a are bonded to the respective lid side terminal portions 16b. After the IDT 22 is sealed with the above process, the support 31 is removed from the Cu layer 38. The piezoelectric substrate 10 is separated into individual pieces or chips to form the acoustic wave device 100 illustrated in FIG. 2A.

As illustrated in FIG. 3A through FIG. 3E, the lid 14 and the lid side terminal portions 16b are made of the same metal layer. Moreover, as illustrated in FIG. 4A through FIG. 4C, the seal ring 12 and the substrate side terminal portions 16a are made of the same metal layer. This simplifies the fabrication process. In addition, since the terminals 16 are located further out than the seal ring 12, it is not necessary to form a penetration hole in the plate portion 13 unlike the technique disclosed in Patent Document 4 for example. Therefore, the fabrication process is simplified, and cost reduction is achieved.

The plate portion 13 may be formed of one of the Ni layer 36 and the Cu layer 38. The plate portion 13 preferably includes the Cu layer 38 to obtain high heat release performance and low electric resistance. However, when only the Cu layer 38 is formed by plating, non-uniformity in thickness of the Cu layer 38 becomes large. Thus, it is preferable to form the Ni layer 36 on the Cu layer 38 to reduce non-uniformity in thickness of the plate portion 13. In addition, the formation of the Ni layer 36 enhances the strength of the plate portion 13. The support 31 is preferably made of a material that functions as a base material, such as SUS304, for plating Cu, and has adhesiveness to an extent that is removed easily after the IDT 22 is sealed. The support 31 and the piezoelectric substrate 10 may be made of a same material to reduce a position gap caused by difference in thermal expansion between the support 31 and the piezoelectric substrate 10. It is preferable that an Al layer or a Cu layer, which has low resistance and is used for electrolytic plating, is formed on the support 31 made of a piezoelectric substance, and then a Ti layer, which has a proper adhesiveness to a plating layer, is formed thereon. The IDT 22 and the metal layer 26 may be formed by stacking a Ti layer and a metal layer mainly including Al in this order from the bottom side, for example. The signal wirings 18a and the grounding wirings 18b may be embedded in the piezoelectric substrate 10 for example. The solder 32 may be included in the seal ring 12 and the substrate side terminal portions 16a.

Figure 5A:
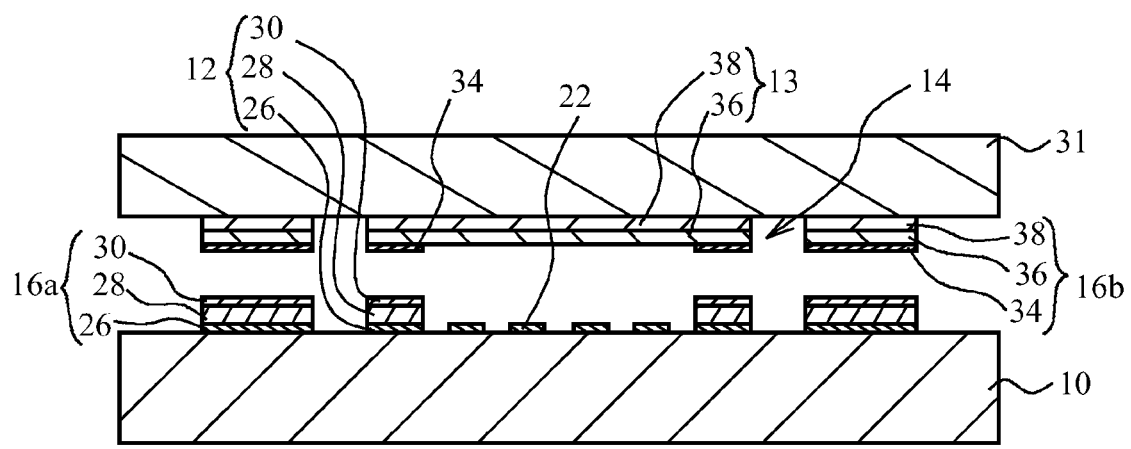
FIG. 5A and FIG. 5B are cross-sectional views illustrating a fabrication method of an acoustic wave device in accordance with a variation of the first embodiment.
Figure 5B:
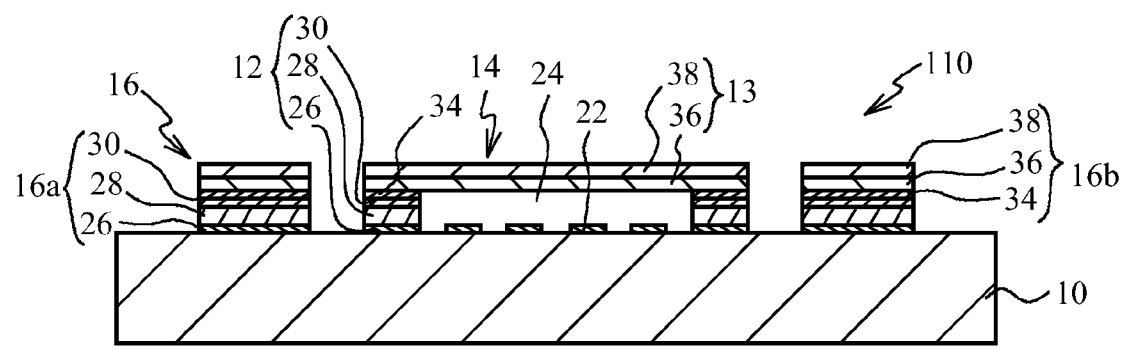

A description will be given of a variation of the first embodiment that does not use the solder 32. FIG. 5A and FIG. 5B are cross-sectional views illustrating a fabrication method of an acoustic wave device 110 in accordance with the variation of the first embodiment. Fabrication steps illustrated in FIG. 3A through FIG. 3E are common to the variation of the first embodiment except that the solder 32 is not formed.

As illustrated in FIG. 5A, the support 31 is disposed on the piezoelectric substrate 10 so that the Au layer 34 and the Au layer 30 face each other. As illustrated in FIG. 5B, the Au layer 34 and the Au layer 30 are made to contact each other, heated to 300° C. for example, and pressed for one hour. This bonds the Au layer 34 and the Au layer 30, and forms the acoustic wave device 110.

Second Embodiment

Figure 6:
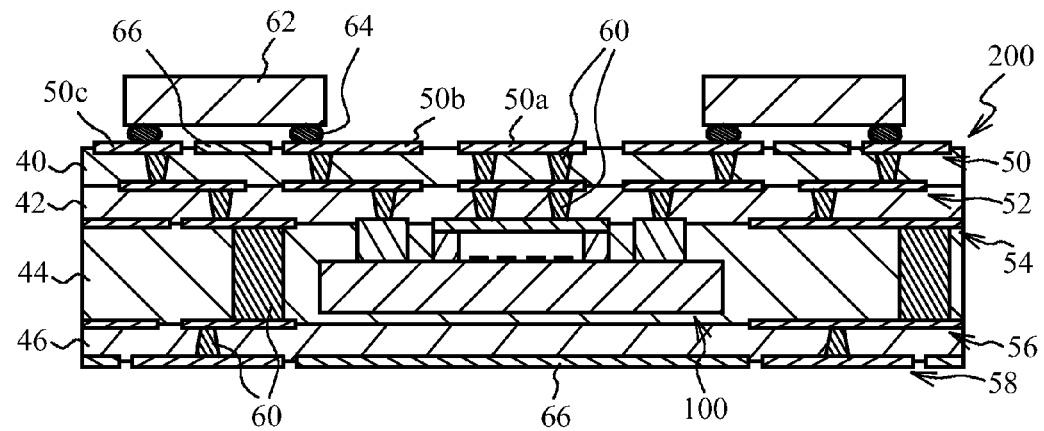
FIG. 6 is a cross-sectional view illustrating a multilayered substrate in accordance with a second embodiment.

A second embodiment is an exemplary multilayered substrate 200 in which an acoustic wave device is embedded. FIG. 6 is a cross-sectional view illustrating the multilayered substrate 200 in accordance with the second embodiment. The acoustic wave device 100 is the same as the one illustrated in FIG. 1A through FIG. 2A, but is simplified in FIG. 6.

As illustrated in FIG. 6, insulating layers 40, 42, 44 and 46 are formed in this order from the upper side. A conductive layer 50 and a solder resist 66 are located on an upper surface of the insulating layer 40, and a conductive layer 52 is located between the insulating layer 40 and the insulating layer 42. A conductive layer 54 is located between the insulating layer 42 and the insulating layer 44, and a conductive layer 56 is located between the insulating layer 44 and the insulating layer 46. A conductive layer 58 and the solder resist 66 are located on a bottom surface of the insulating layer 46. The conductive layers are interconnected by via wirings 60 which pierce through the insulating layers in a vertical direction. Each conductive layer and the via wirings 60 are made of a metal such as Cu. Each insulating layer is a resin layer made of epoxy resin or the like.

The acoustic wave device 100 is embedded in the insulating layer 44. A terminal 50a included in the conductive layer 50 is a ground terminal or a signal terminal for transmitting a signal, for example. The terminal 50a is connected to the lid 14 of the acoustic wave device 100 (see FIG. 2A) through the via wirings 60 and the conductive layer 52. The via wirings 60, the conductive layer 52 and the terminal 50a are made of a metal, and function as a heat release path for releasing heat generated in the acoustic wave device 100. Thus, it is possible to ensure high heat release performance. The via wirings 60 are preferably made of Cu, and the lid 14 preferably includes the Cu layer 38 as illustrated in FIG. 2A. This is because the via wirings 60 can be bonded to the Cu layer 38 successfully, and the heat release performance becomes high. In addition, since the IDT 22 is sealed with metal, and the acoustic wave device 100 is embedded in the insulating layer 44, high moisture resistance is achieved.

Two chip components 62 are flip-chip mounted on an upper surface of the multilayered substrate 200. The chip component 62 is a passive element such as a resistor, a chip inductor or a chip conductor, or an active element such as an IC (Integrated Circuit), and is connected to terminals 50b and 50c in the conductive layer 50 via solder balls 64. The terminal 50b is electrically connected to the terminal 16 of the acoustic wave device 100 through the via wirings 60. The terminal 50c is electrically connected to the conductive layer 58 through the via wirings 60, the conductive layers 52, 54 and 56. The conductive layer 58 functions as a terminal for external connection. The solder resists 66 prevent solders, which are solders of the solder balls 64 bonded to the terminals 50b and 50c, and solders bonded to a part of the conductive layer 58 to mount the multilayered substrate 200 to an external device, from adhering to undesigned parts of the conductive layers 50 and 58.

Next, a description will be given of a fabrication method of the multilayered substrate 200. FIG. 7A through FIG. 8C are cross-sectional views illustrating the fabrication method of the multilayered substrate 200 in accordance with the second embodiment.

Figure 7A:
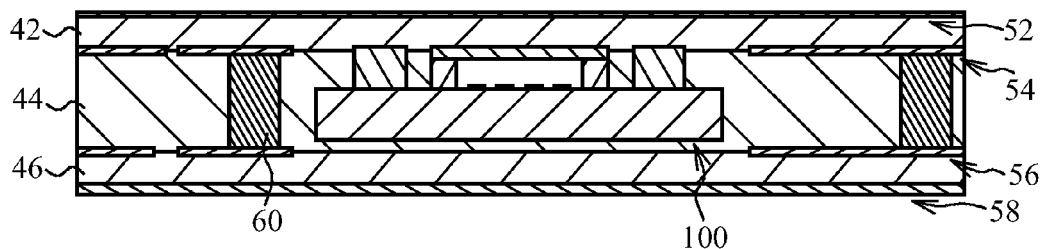
FIG. 7A through FIG. 7D are cross-sectional views illustrating a fabrication method of the multilayered substrate of the second embodiment.
Figure 7B:
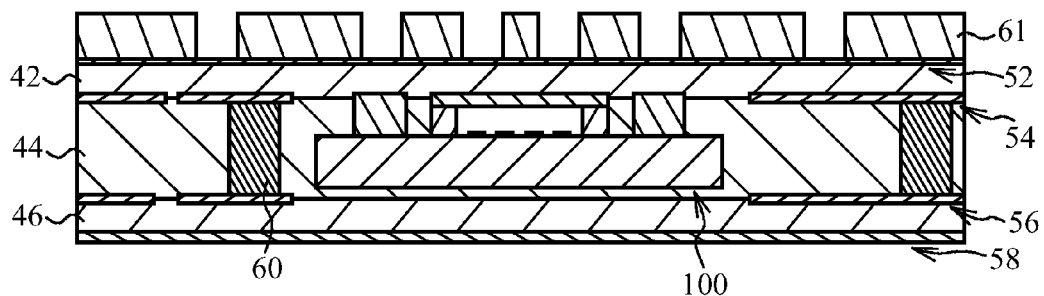
Figure 7C:
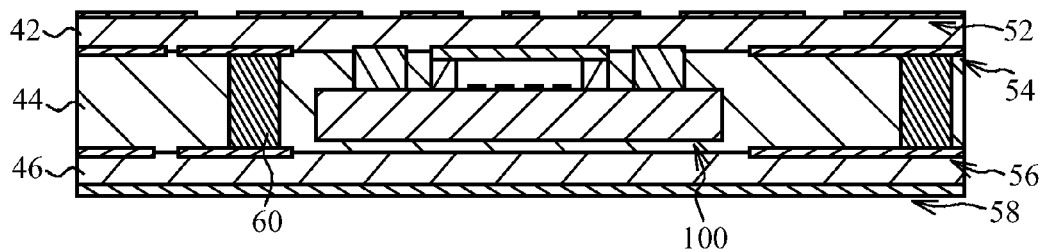
Figure 7D:
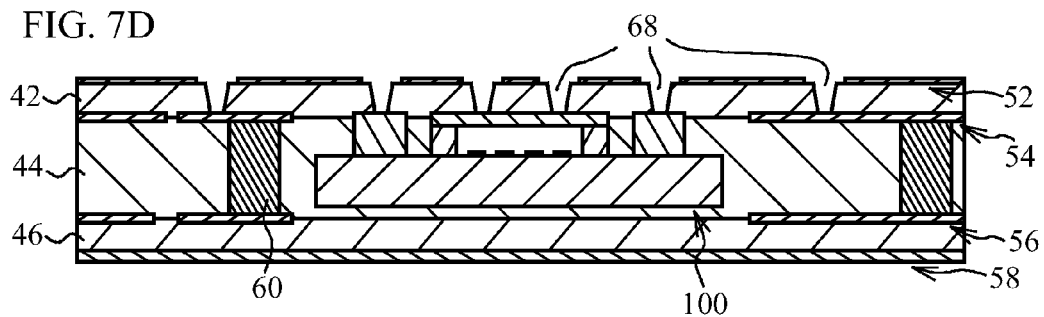

As illustrated in FIG. 7A, the acoustic wave device 100 is embedded in the insulating layer 44. The insulating layer 40 and the conductive layer 50 are not formed. As illustrated in FIG. 7B, a resist 61 are formed on an upper surface of the conductive layer 52. A part of the conductive layer 52 is exposed from apertures of the resist 61. As illustrated in FIG. 7C, the exposed part of the conductive layer 52 is removed by etching. The insulating layer 42 is exposed from parts formed by removal of the conductive layer 52. As illustrated in FIG. 7D, through-holes 68 are formed by laser irradiation to form the via wirings 60 in the insulating layer 42.

Figure 8A:
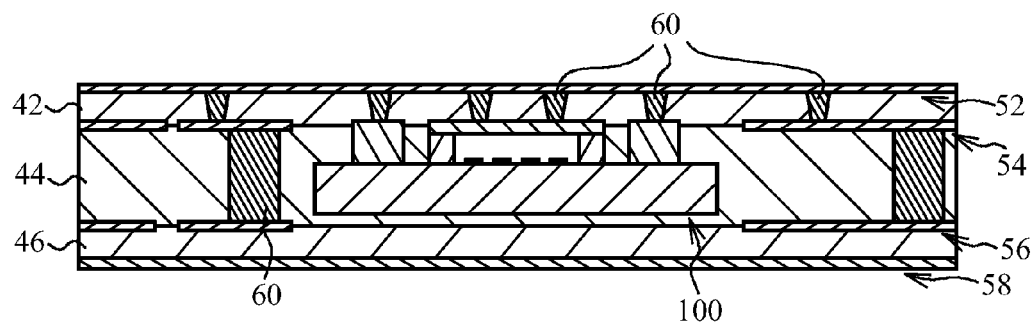
FIG. 8A through FIG. 8C are cross-sectional views illustrating the fabrication method of the multilayered substrate of the second embodiment.
Figure 8B:
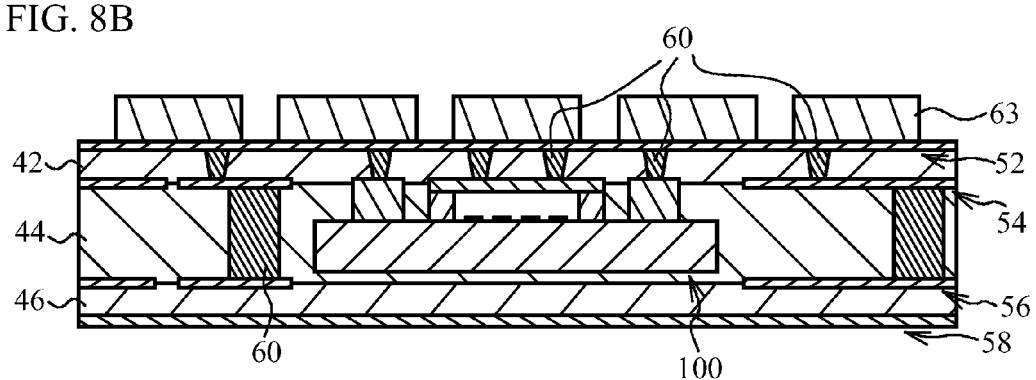
Figure 8C:
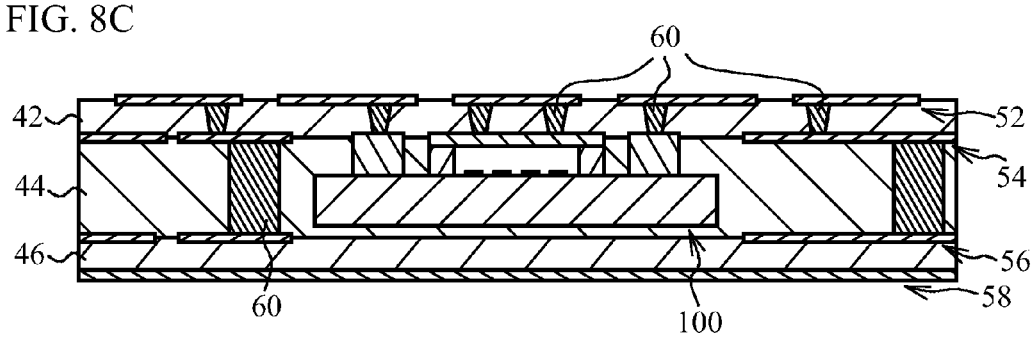

As illustrated in FIG. 8A, the via wirings 60 are formed in the through-holes 68. A seed metal is provided by non-electrolytic plating, and the via wirings 60 are formed by electrolytic plating using the seed metal as an electrical supply line. A plating layer is also formed in the conductive layer 52, and a thickness of the conductive layer 52 becomes large. As illustrated in FIG. 8B, a resist 63 is formed on the conductive layer 52. As illustrated in FIG. 8C, a part of the conductive layer 52 exposed from apertures of the resist 63 is removed by etching, and a patterning of the conductive layer 52 is performed. It is not illustrated, but the process same as the above described process is performed to the insulating layers 40 and 46 to form the multilayered substrate 200. In addition, the chip components 62 illustrated in FIG. 6 are mounted on the multilayered substrate 200.

When the height of the lid is different from that of the terminal as disclosed in Patent Documents 2 and 4 for example, it is required to provide through-holes having different depths to the substrate. Thus, multiple-times laser irradiation is necessary. In addition, the formation of the via wirings having different heights requires the adjustment of component of plating solution, and complicates the plating process. On the contrary, the height of the plate portion 13 in the acoustic wave device 100 is equal to the heights of the terminals 16 in the second embodiment. Therefore, the through-holes 68 are formed on the plate portion 13 and the terminals 16 by one-time laser irradiation. The via wiring 60 contacting the upper surface of the plate portion 13 and the via wiring 60 contacting the upper surface of the terminal 16 have heights equal to each other, and are made of a same material (e.g. Cu). Thus, the via wirings 60 can be easily formed by one-time plating. This simplifies the fabrication process, and enables to reduce cost. In addition, even when the through-holes 68 are formed using a method such as etching besides laser, the through-holes 68 are formed with a simple fabrication process. FIG. 7A through FIG. 9C illustrate a subtractive method, but the multilayered substrate 200 may be formed using a semi-additive method for example.

Figure 9:
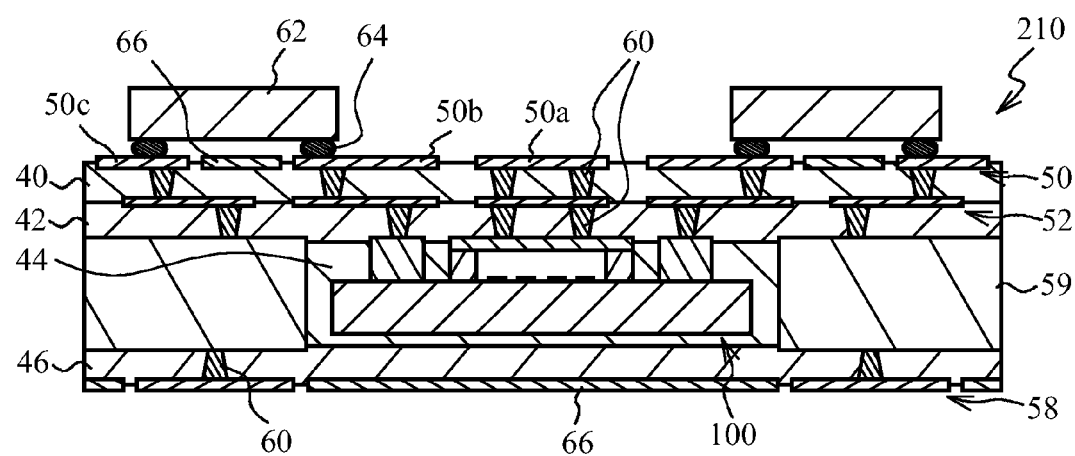
FIG. 9 is a cross-sectional view illustrating a multilayered substrate in accordance with a variation of the second embodiment.

A description will now be given of a variation of the second embodiment. FIG. 9 is a cross-sectional view illustrating a multilayered substrate 210 in accordance with the variation of the second embodiment.

As illustrated in FIG. 9, a core 59 made of a metal such as Cu is located between the insulating layer 42 and the insulating layer 46. The conductive layers 54 and 56 are not formed. The core 59 is connected to the conductive layers 52 and 58 through the via wirings 60. The thickness of the core 59 is larger than thicknesses of the conductive layers 52 and 58. The strength of the multilayered substrate 210 and the heat release performance are enhanced due to the core 59 made of a metal and having a large thickness.

The first and second embodiments may be applied to an FBAR (Film Bulk Acoustic Resonator) besides the SAW device. In the FBAR, the functional element exciting acoustic waves is a resonance region in which a lower electrode, a piezoelectric thin film, and an upper electrode overlap each other. The resonance region is sealed so that the space is formed thereabove. In addition, the first and second embodiments are applied to an acoustic wave filter such as a ladder-type filter and a multimode filter, and a duplexer. In the duplexer, the embodiments can be applied to both a reception filter and a transmission filter, and is especially preferably applied to the transmission filter of which the amount of heat generation is large.

Although the embodiments of the present invention have been described in detail, it is to be understood that the various change, substitutions, and alterations could be made hereto without departing from the spirit and scope of the invention.

What is claimed is:

1. An acoustic wave device comprising:
   a substrate;
   a functional element that is located on the substrate and excites acoustic waves;
   a side wall portion that is made of a metal and is located on the substrate so as to surround the functional element;
   a metal plate that is located above the functional element and the side wall portion, and seals the functional element so that a space is formed above the functional element; and
   a terminal that is located on the substrate and further out than the side wall portion, and is electrically connected to the functional element.

2. The acoustic wave device according to claim 1, wherein a height of an upper surface of the metal plate is equal to that of an upper surface of the terminal when an upper surface of the substrate is used as a reference.

3. The acoustic wave device according to claim 1, wherein the side wall portion includes a first side wall portion at a side of the metal plate and a second side wall portion at a side of the substrate, and the first side wall portion and the second side wall portion are bonded to each other by a solder.

4. The acoustic wave device according to claim 1, wherein the side wall portion includes a first side wall portion at a side of the metal plate and a second side wall portion at a side of the substrate, and a gold layer of the first side wall portion and a gold layer of the second side wall portion are bonded to each other.

5. A multilayered substrate comprising:
   a conductive layer and an insulating layer that are stacked; and
   the acoustic wave device according to claim 1 that is embedded in the multilayered substrate.

6. The multilayered substrate according to claim 5, further comprising:
   a first via wiring that pierces through the insulating layer, and contacts an upper surface of the metal plate; and
   a second via wiring that pierces through the insulating layer, and contacts an upper surface of the terminal.

7. The multilayered substrate according to claim 6, further comprising:
   a conductive layer that is provided on a surface of the substrate, and is electrically connected to the first via wiring contacting the upper surface of the metal plate.

8. The multilayered substrate according to claim 6, wherein
   the first via wiring contacting the upper surface of the metal plate and the second via wiring contacting the upper surface of the terminal are made of a same material.

9. The acoustic wave device according to claim 1, further comprising:
   a signal wiring that connects between the functional element and the terminal; and
   a resin portion that covers the signal wiring and is located between the signal wiring and the side wall portion.

* * * * *